United States Patent
Lillestolen et al.

(10) Patent No.: US 7,977,936 B2
(45) Date of Patent: Jul. 12, 2011

(54) RESOLVER INTERFACE AND SIGNAL CONDITIONER

(75) Inventors: Kirk A. Lillestolen, East Hartland, CT (US); James Saloio, Jr., Ludlow, MA (US); Ronald P. Bauer, Windsor Locks, CT (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 456 days.

(21) Appl. No.: 12/252,603

(22) Filed: Oct. 16, 2008

(65) Prior Publication Data

US 2010/0097052 A1 Apr. 22, 2010

(51) Int. Cl.
*G01B 7/30* (2006.01)
(52) U.S. Cl. .................................. 324/207.25
(58) Field of Classification Search .......... None
See application file for complete search history.

(56) References Cited

U.S. PATENT DOCUMENTS

| | | | |
|---|---|---|---|
| 3,735,391 A | 5/1973 | Games et al. | |
| 4,062,005 A * | 12/1977 | Freed et al. | 340/870.18 |
| 4,328,483 A * | 5/1982 | Swartz et al. | 318/562 |
| 4,390,865 A * | 6/1983 | Lauro | 341/116 |
| 4,472,669 A * | 9/1984 | Denham et al. | 318/661 |
| 4,511,884 A * | 4/1985 | Serev et al. | 341/116 |
| 5,134,397 A * | 7/1992 | Eyerly et al. | 341/116 |
| 5,189,620 A | 2/1993 | Parsons et al. | |
| 5,488,323 A | 1/1996 | Beacham, Jr. et al. | |
| 6,211,633 B1 | 4/2001 | Jones et al. | |
| 6,255,794 B1 | 7/2001 | Staebler | |
| 6,331,759 B1 * | 12/2001 | Atmur | 318/661 |
| 6,389,373 B1 | 5/2002 | Ohya | |
| 6,484,120 B1 | 11/2002 | Goto et al. | |
| 6,643,606 B2 | 11/2003 | Kim | |
| 6,707,401 B2 | 3/2004 | Kushihara | |
| 6,754,610 B2 | 6/2004 | Dudler et al. | |
| 6,891,346 B2 | 5/2005 | Simmons et al. | |
| 6,891,492 B1 | 5/2005 | Kushihara | |
| 6,958,602 B2 | 10/2005 | Matsuura et al. | |
| 7,009,535 B2 | 3/2006 | Kanekawa et al. | |
| 7,047,145 B2 | 5/2006 | Ishizuka et al. | |
| 2004/0001015 A1 | 1/2004 | Games | |
| 2004/0193988 A1 | 9/2004 | Saloio | |

* cited by examiner

*Primary Examiner* — Paresh Patel

(74) *Attorney, Agent, or Firm* — Carlson, Gasley & Olds, P.C.

(57) ABSTRACT

A resolver interface includes separate anti-aliasing filters for sine and cosine signals. The separately filtered signals are then time share multiplexed to a single analog to digital (A/D) converter. Because all of the inputs are fed through the same A/D converter, any error, difference or shift caused by the A/D converter is shared across al of the inputs. A Field Programmable Gate Array (FPGA) and processor are used to digitally filter, demodulate and compute position.

19 Claims, 3 Drawing Sheets

RESOLVER INTERFACE AND SIGNAL CONDITIONER

This invention was made with government support under Contract No.: w58rgz-05-c-0001 awarded by the United States Army. The government therefore may have certain rights in this invention.

BACKGROUND OF THE INVENTION

This disclosure generally relates to an interface and method of conditioning signals from a positional measuring device. More particularly, this disclosure relates to a resolver interface and method for conditioning signals from the resolver for improving accuracy of the resolver interface.

A resolver is utilized for measuring and communicating a rotational position of a rotating member such as for example a motor shaft. The rotational position of a rotating member is communicated to provide for accurate control and operation. A conventional resolver provides a raw analog signal that is conditioned to generate a signal in a desired form. An interface including software and electronic hardware is utilized to condition signals received from the resolver and produce a signal in a desired form. The accuracy of the position measured is dependent not only on the resolver itself but also on the robustness of the interface utilized to condition resolver output signals.

Accordingly, it is desirable to design and develop a resolver interface capable of providing a desired accuracy regardless of the operating environment.

SUMMARY OF THE INVENTION

A disclosed resolver interface includes separate anti-aliasing filters for sine cosine and excitation signals. The separately filtered signals are then time share multiplexed to a single analog to digital (A/D) converter. Because all of the inputs are fed through the same A/D converter, any error, difference or shift caused by the A/D converter is shared across all inputs.

The A/D converter is controlled according to a control algorithm provided by a field programmable gate array (FPGA). The FPGA includes a sine wave generator that produces the excitation signal. The signals from the A/D converter are fed through digital filter in the FPGA. Because the digital filter is part of the FPGA each of the digital filters can be of an identical configuration, thereby eliminating any inherent inaccuracies potentially present with separate components. The digital demodulation calculations are synchronized with the resolver excitation frequency as both are performed by the FPGA. A "sliding" sine/cosine look up table keeps the table synchronized to the excitations phase and update rate in order to provide a correct indication of the quadrant of the phase results for each data update.

Accordingly, the disclosed example resolver interface provides improved accuracy by reducing points of error or differentiation between signals from the initial filter to final calculations.

These and other features of the present invention can be best understood from the following specification and drawings, the following of which is a brief description.

DETAILED DESCRIPTION OF THE PREFERRED EMBODIMENT

Figure 1:
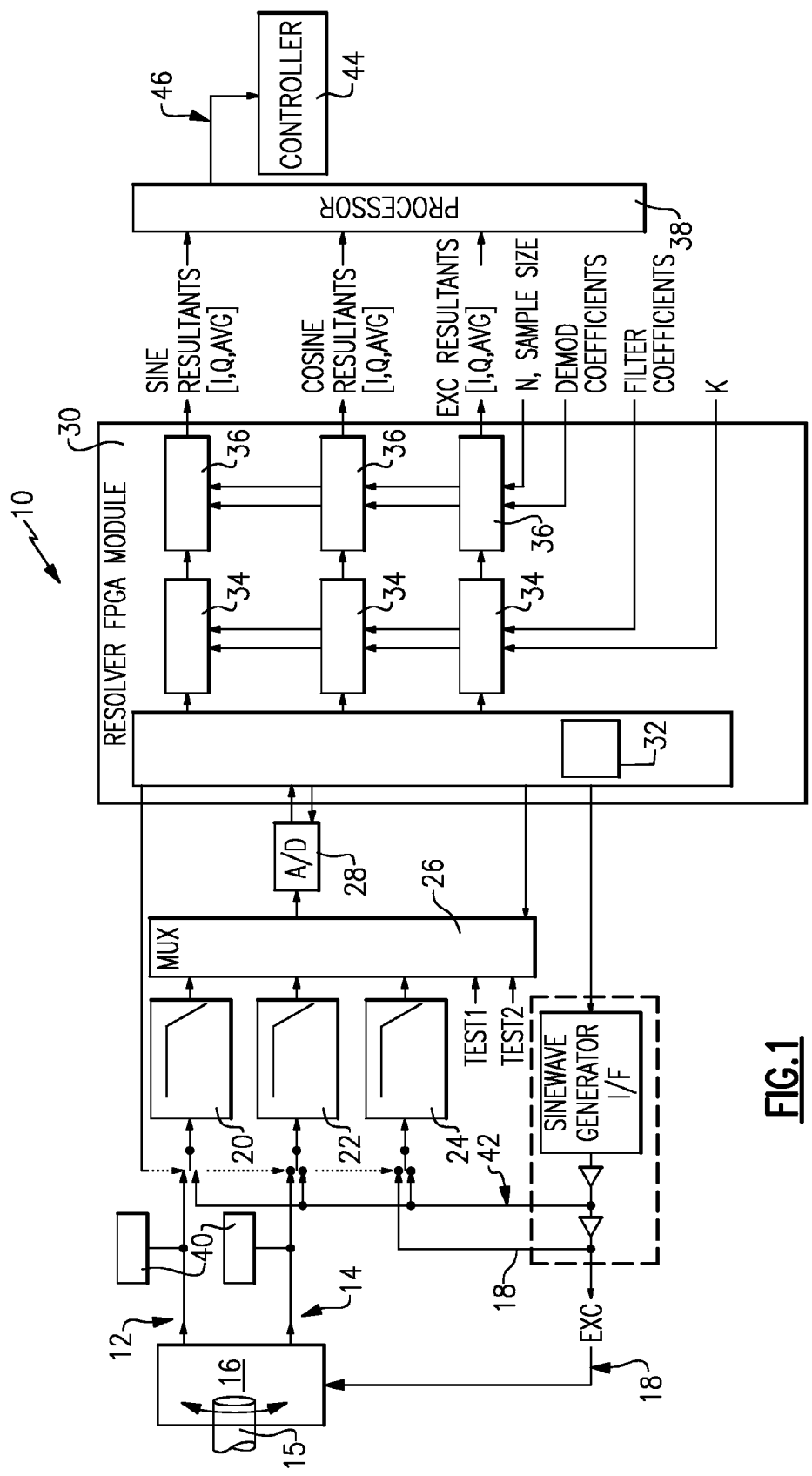
FIG. 1 is a schematic diagram of an example resolver interface.

Referring to FIG. 1, a resolver interface and signal conditioner 10 is schematically shown and receives a sine input 12 and a cosine input 14 from a resolver 16. The sine input 12 and the cosine input 14 provide an analog signal indicative of a position of a rotary device 15 for four-quadrant accuracy and operation. The resolver interface 10 converts the analog signals 12, 14 into a four-quadrant angular position of the rotary device 15. The converted angular position is then communicated to a controller 44 or other device that utilizes the rotational position information. Although, the disclosed example is a resolver interface, one skilled in the art would recognize the benefits applicable to other known differential position sensors such as for example a linear variable differential transformer (LVDT) and a rotary variable differential transformer (RVDT).

The resolver 16 receives an excitation signal 18 that provides for the generation of the sine input 12 and cosine input 14 to the resolver interface 10. The sine input 12 is fed through a first anti-aliasing filter 20. The cosine input 14 is fed through a second anti-aliasing filter 22. The excitation signal 18 can optionally be fed by way of an external or internal path through a third anti-aliasing filter 24. The filtered signals from the anti-aliasing filters 20, 22, and 24 are routed through a multiplexer 26 to an analog to digital (A/D) converter 28. Because the inputs 12 and 14 are fed through the same A/D converter 28, any error, difference or shift caused by the A/D converter 28 is shared across the inputs 12, 14 and optionally 18, and the effect on the resulting position accuracy is minimized.

The multiplexer 26 interleaves the inputs 12, 14 and 18 to provide substantially simultaneous sequencing of the sine, cosine and excitation signals. The near simultaneous sampling of the sine and cosine resolver signals 12, and 14 reduces errors caused by resolver position slewing because position/signal amplitudes do not significantly change during the time between sampling the sine and cosine resolver outputs.

Because separate anti-aliasing filters 20, 22, and therefore separate gain paths are utilized for each of the signals 12, and 14, the example anti-alias filters 20 and 22, are optimized such that there is minimal gain mis-match at the resolver excitation frequency.

Figure 2:
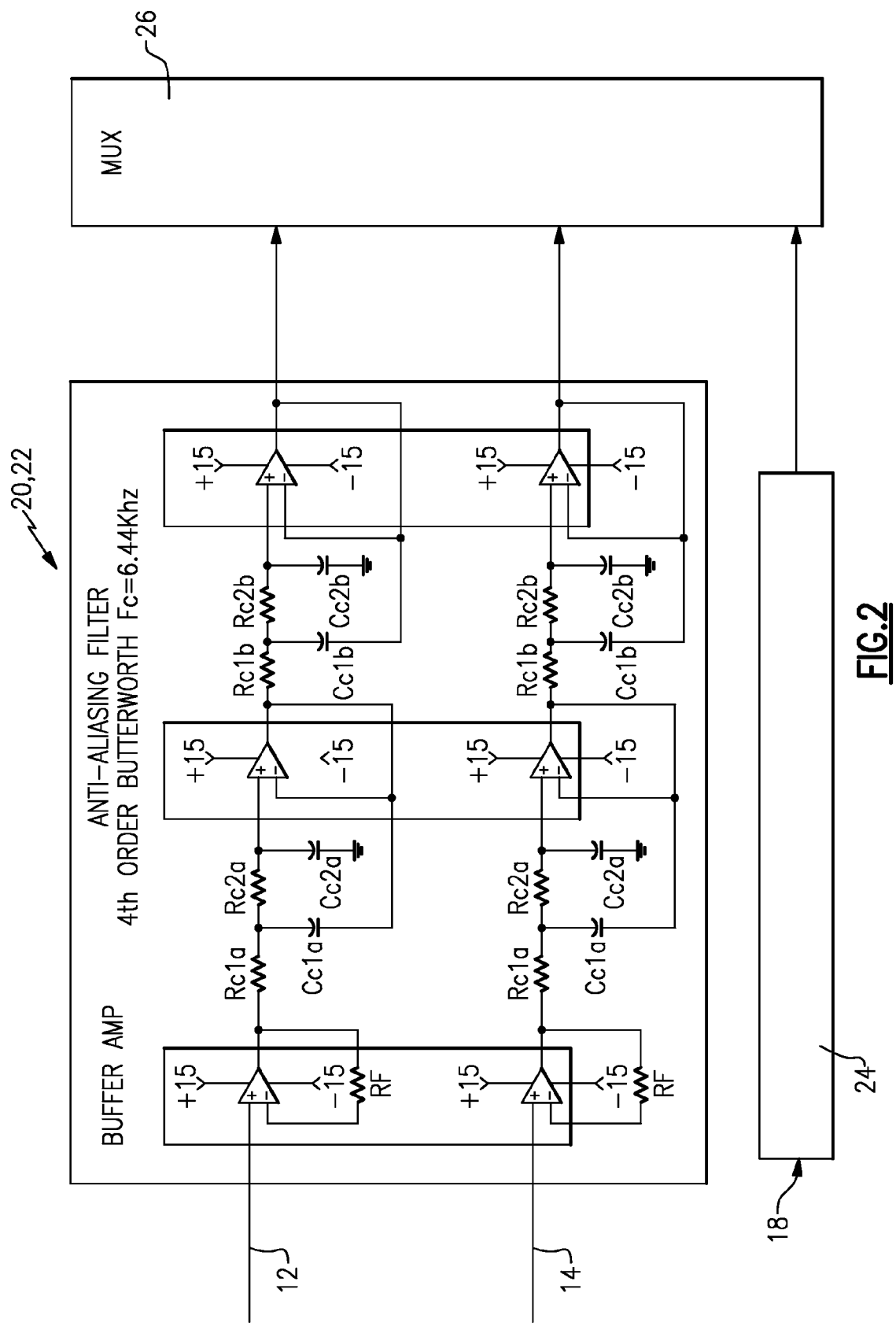
FIG. 2 is a schematic diagram of an example anti-aliasing filter.

Referring to FIG. 2, each of the example anti-aliasing filters 20 and 22 include dual op-amps with matching performance characteristics. The example anti-aliasing filters 20, 22 comprise a buffer amp and a $4^{th}$ order Sallen-Key gain Butterworth low-pass filter having a frequency cut off of 6.44 kHz. The Sallen-Key unity gain topology is also critical in achieving an optimally matched gain across the sine and cosine inputs. As appreciated, other anti-aliasing filters can be utilized for removing undesired out of frequency band signals.

Figure 3:
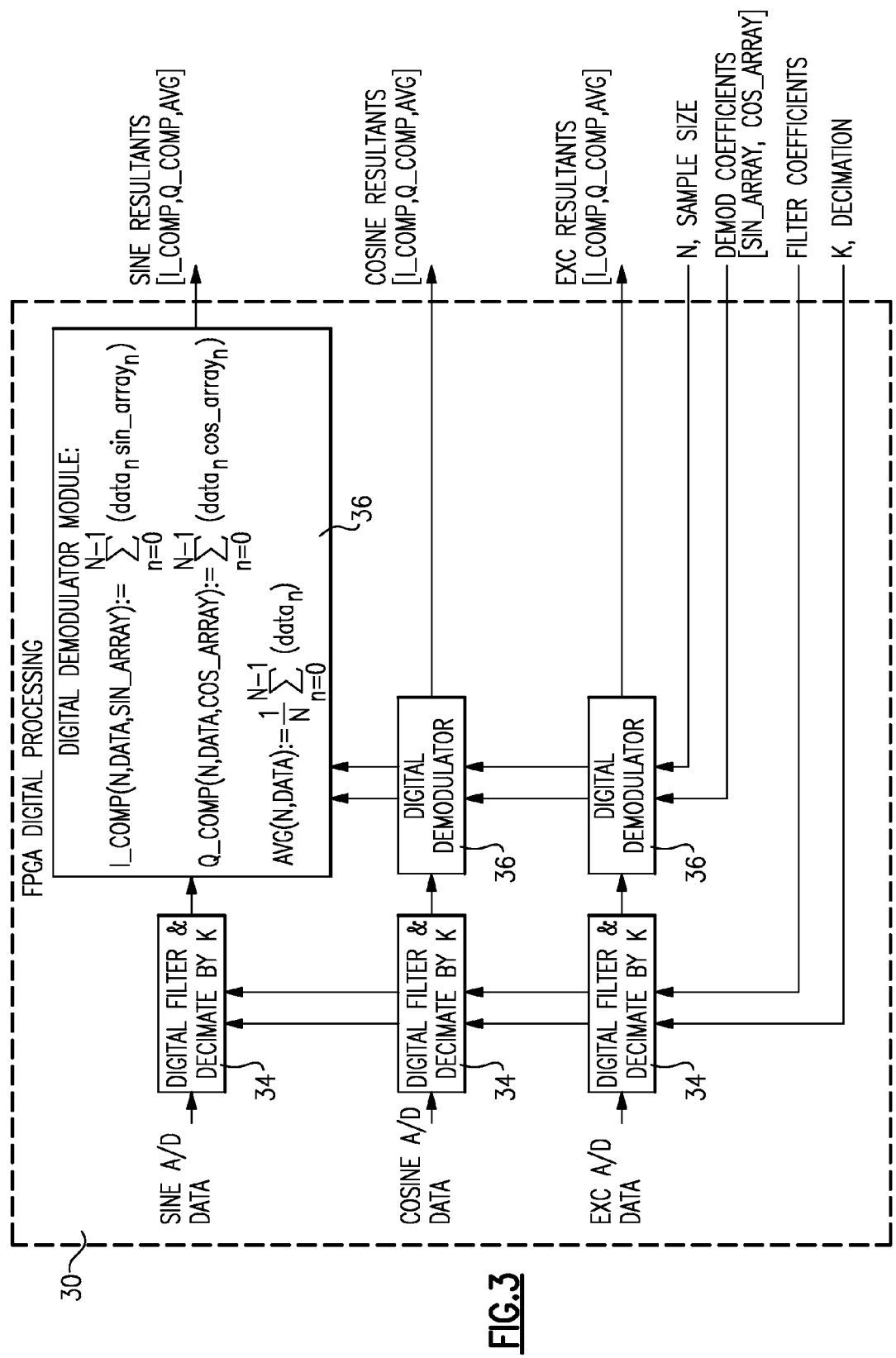
FIG. 3 is a schematic diagram of an example controller.

Referring to FIGS. 1 and 3, the output from the multiplexer 26 is fed to the A/D converter 28. The A/D converter 28 is controlled according to a control algorithm provided by a field programmable gate array (FPGA) 30. The FPGA 30 includes a sine wave generator 32 that produces the excitation signal 18. Further, the FPGA 30 includes digital filters 34. The A/D converter 28 over-samples the input signals 120 times the resolver excitation frequency. In this example, the 400 Hz resolver excitation frequency is over-sampled sampled 120 times for each cycle of the 400 Hz excitation signal 18. The over-sampling of the excitation frequency provides for the use of a Finite Impulse Response (FIR) digital filter for noise rejection of frequencies outside the example excitation frequency of 400 Hz.

The over-sampled sine, cosine and excitation signals 12, 14, 18 are fed from the A/D 28 to the FPGA 30. Within the FPGA 30, the signals are first fed through a digital filter 34. The digital filter is part of the FPGA 30 and therefore each of the digital filters 34 can be of an identical configuration, eliminating any inherent inaccuracies potentially present with discrete analog components. Digital filtering further removes any out of band frequencies and noise that could detrimentally effect calculation and determination of resolver position.

After each signal is digitally filtered, the over sampled points are decimated by 10 to reduce the number of sample points from 120 to 12. The decimate operation takes every $10^{th}$ sample point and discards the intervening nine points. The decimation operation produces the final output rate equal to 12 times the resolver excitation frequency for each of the signals 12, 14, 18. A position calculation is performed on every $10^{th}$ sample from the decimated signals. In the example FPGA module 10 the last 12 points are utilized for each computation, with the oldest data point being dropped for each computation.

The digital demodulation calculations are synchronized with the resolver excitation frequency as both are performed by the FPGA 30. A "sliding" sine/cosine look up table keeps the table synchronized to the excitations phase and update rate in order to provide correct four quadrant phase results.

The digital demodulators 36 perform demodulation calculations to compute the in phase and quadrature phase orthogonal components of the sine and cosine resolver signals and excitation wrap-around A/D data. The in-phase and quadrature phase resultants are used to compute the magnitude of the sine and cosine signals with substantially little signal loss caused by phase variation.

The in-phase (i_comp) and quadrature-phase (q_comp) component calculation is performed on the resolver sine, cosine and excitation wrap-around sampled A/D data. As each new A/D sample is acquired, the following computation according to the below Equations 1 and 2 is performed on the last 12 received data points.

Equation 1

$$\text{i\_comp}, I(n) = \sum_{n=0}^{N-1} x(n) \cdot \sin\left[\frac{2 \cdot \pi \cdot n}{N}\right]$$

Equation 2

$$\text{q\_comp}, Q(n) = \sum_{n=0}^{N-1} x(n) \cdot \cos\left[\frac{2 \cdot \pi \cdot n}{N}\right]$$

Where: i-comp, I(n)=in-phase resultant.
q_comp, Q(n)=quadrature phase resultant.
x(n)–A/D sampled data
N=decimated number of samples per resolver excitation frequency cycle (12 in this example).

Equations (1) and (2) describe the operations performed on a block of samples, in this example 12, that encompass complete cycles of the resolver excitation frequency. The Equations (1) and (2) do not illustrate how the computations are indexed and updated upon acquiring each new decimated A/D sample. Equations (3) and (4) below are alternate forms of the above equations that illustrate how the samples are updated such that the last 12 filtered and decimated samples are utilized for the in-phase and quadrature phase calculations. Further, to maximize the resolver angle calculation update rate such that a new update is computed at N times the resolver excitation frequency (once per decimated A/D sample), Equations (3) and (4) are utilized.

Equation 3

$$\text{i\_comp}, I(n) = x(n) \cdot \sin\left[\frac{2 \cdot \pi \cdot n}{N}\right] + x(n-1) \cdot \sin\left[\frac{2 \cdot \pi \cdot (n-1)}{N}\right] + \quad (3)$$
$$x(n-2) \cdot \sin\left[\frac{2 \cdot \pi \cdot (n-2)}{N}\right] + \ldots +$$
$$x(n-(N-1)) \cdot \sin\left[\frac{2 \cdot \pi \cdot (n-(N-1))}{N}\right]$$

Equation 4

$$\text{q\_comp}, Q(n) = x(n) \cdot \cos\left[\frac{2 \cdot \pi \cdot n}{N}\right] + x(n-1) \cdot \cos\left[\frac{2 \cdot \pi \cdot (n-1)}{n}\right] + \quad (4)$$
$$x(n-2) \cdot \cos\left[\frac{2 \cdot \pi \cdot (n-2)}{N}\right] + \ldots +$$
$$x(n-(N-1)) \cdot \cos\left[\frac{2 \cdot \pi \cdot (n-(N-1))}{N}\right].$$

In Equations (3) and (4), x (n) represents the most recent A/D sample, x (n−1) represents the previous sample, and additional past data samples are further presented according to this convention. As appreciated, the disclosed example utilizes the last 12 decimated samples, however, more or less samples could be utilized depending on the desired application and specific system performance required.

Equations (5) and (6) below are simplified to facilitate implementation by the digital logic of the FPGA 30.

Equation 5

$$\text{i\_comp}, I(n) = x(n) \cdot \sin\left[\frac{2 \cdot \pi \cdot n}{N}\right] + I(n-1) - \quad (5)$$
$$x(n-N) \cdot \sin\left[\frac{2 \cdot \pi \cdot (n-N)}{N}\right].$$

Equation 6

$$\text{q\_comp}, Q(n) = x(n) \cdot \cos\left[\frac{2 \cdot \pi \cdot n}{N}\right] + Q(n-1) - \quad (6)$$
$$x(n-N) \cdot \cos\left[\frac{2 \cdot \pi \cdot (n-N)}{N}\right].$$

Where: I(n−1), and Q(n−1) are the I and Q resultants, and N=12.

Equations (5) and (6) provide a simplified alternative to Equations (3) and (4) and require only two multiplies and three summations to produce a single result. Equations (5) and (6) each involves multiplying a properly indexed sine and cosine array by the current A/D sample and adding the result to the previous in-phase and quadrature phase resultant, and then subtracting the oldest sine or cosine term.

The sine and cosine functions repeat every N samples and can be implemented using a circular look up table including N sample points. In this example N is equal to 12. An example 12 point circular look up table for sine and cosine in puts are shown below.

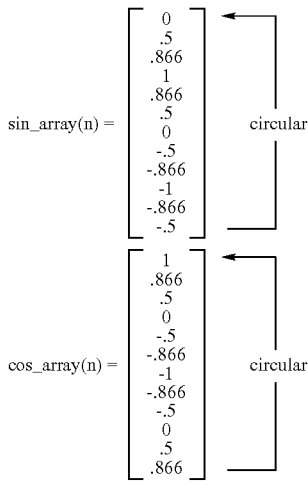

The proper indexing of the sine and cosine array values in the above look-up table provide for computing of the proper four quadrant phase (0-360 degrees) result that is computed based on the final in-phase and quadrature phase results. As appreciated, the example look up tables are directed to the disclosed example including 12 samples. The example look up tables could be modified to match the number of desired samples.

The above Equations (3), (4), (5), and (6) produce the same resultants and provide a new in-phase and quadrature phase resultant for every new filtered and decimated A/D sample for an update equal to 12 times the resolver frequency in this example.

The values from the FPGA 30 are input into a processor 38 for transformation into a value, schematically indicated at 46, indicative of an angular position of the rotary device 15 that is communicated to the controller 44. The sine, cosine, excitation and other data generated by the FPGA 30 as indicated above is utilized to provide the desire angular position value 46 that can be utilized by the controller 44.

The processor 38 performs an initial magnitude calculation on the sine, cosine and excitation values as indicated by the following example equations.

$$\text{sin\_mag\_}vp = m \cdot \sqrt{(\text{sin\_}q\text{\_comp})^2 + (\text{sin\_}i\text{\_comp})^2} \quad \text{Equation 7.}$$

$$\text{cosine\_mag\_}vp = m \cdot \sqrt{(\text{cosin\_}q\text{\_comp})^2 + (\text{cossin\_}i\text{\_comp})^2} \quad \text{Equation 8.}$$

$$\text{excitation\_mag\_}vp = m \cdot \sqrt{(\text{exc\_}q\text{\_comp})^2 + (\text{exc\_}i\text{\_comp})^2} \quad \text{Equation 9.}$$

Where: m=scaling factor for converting the results into volts peak referenced to the interface input.

The values sin_mag_vp and cos mag vp are magnitude vectors computed above and as such are always positive resultants. Because the magnitude vector results will always be positive, the arctan function used to compute the resolver angle is forced into the first quadrant. For this reason, as shown below in equation 12, the i_comp component result of both the sine and cosine resolver inputs are used in conjunction with the arctan function to determine the correct 4-quadrant result.

Equation 12

$$\text{angle\_deg} =$$

$$\begin{cases} \frac{360}{2\pi} \cdot \arctan\left(\frac{\text{sin\_mag\_vp}}{\text{cos\_mag\_vp}}\right) \xrightarrow{IF} \text{sin\_i\_comp} \geq 0 \wedge \text{cos\_i\_comp} > 0 \\ \frac{360}{2\pi} \cdot \left[\frac{\pi}{2} + \arctan\left(\frac{\text{cos\_mag\_vp}}{\text{sin\_mag\_vp}}\right)\right] \xrightarrow{IF} \text{sin\_i\_comp} > 0 \wedge \text{cos\_i\_comp} \leq 0 \\ \frac{360}{2\pi} \cdot \left[\pi + \arctan\left(\frac{\text{sin\_mag\_vp}}{\text{cos\_mag\_vp}}\right)\right] \xrightarrow{IF} \text{sin\_i\_comp} \leq 0 \wedge \text{cos\_i\_comp} < 0 \\ \frac{360}{2\pi} \cdot \left[\frac{3\pi}{2} + \arctan\left(\frac{\text{cos\_mag\_vp}}{\text{sin\_mag\_vp}}\right)\right] \xrightarrow{IF} \text{sin\_i\_comp} < 0 \wedge \text{cos\_i\_comp} \geq 0 \end{cases}$$

Where: the symbol "^" above=Logical AND. All other variable nomenclature is as defined in the previous magnitude calculations.

The resulting angle_deg value from equation 12 is the angular value 46 that is input to the controller 44 for use by other systems and processes that require information about the current angular position of the rotary device 15.

It should be understood, that the above Equations can be implemented in digital logic or by a processor and involve computing in-phase and quadrature-phase resultants of the sampled resolver sine and cosine output signals of the resolver excitation signals. Further, it should also be noted that a computing device can be used to implement various functionality, such as that attributable to the method of digital demodulation and other functions performed by the FPGA 30. In terms of hardware architecture, such a computing device can include a processor, a memory, and one or more input and/or output (I/O) device interface(s) that are communicatively coupled via a local interface. The local interface can include, for example but not limited to, one or more buses and/or other wired or wireless connections. The local interface may have additional elements, which are omitted for simplicity, such as controllers, buffers (caches), drivers, repeaters, and receivers to enable communications. Further, the local interface may include address, control, and/or data connections to enable appropriate communications among the aforementioned components.

The processor may be a hardware device for executing software, particularly software stored in memory. The processor can be a custom made or commercially available processor, a central processing unit (CPU), an auxiliary processor among several processors associated with the computing device, a semiconductor based microprocessor (in the form of a microchip or chip set) or generally any device for executing software instructions.

The memory can include any one or combination of volatile memory elements (e.g., random access memory (RAM, such as DRAM, SRAM, SDRAM, VRAM, etc.)) and/or nonvolatile memory elements (e.g., ROM, hard drive, tape, CD-ROM, etc.). Moreover, the memory may incorporate electronic, magnetic, optical, and/or other types of storage media. Note that the memory can also have a distributed architecture, where various components are situated remotely from one another, but can be accessed by the processor.

The software in the memory may include one or more separate programs, each of which includes an ordered listing of executable instructions for implementing logical functions. A system component embodied as software may also be construed as a source program, executable program (object code), script, or any other entity comprising a set of instructions to be performed. When constructed as a source program, the program is translated via a compiler, assembler, interpreter, or the like, which may or may not be included within the memory.

The Input/Output devices that may be coupled to system I/O Interface(s) may include input devices, for example but not limited to, a keyboard, mouse, scanner, microphone, camera, proximity device, etc. Further, the Input/Output devices may also include output devices, for example but not limited to, a printer, display, etc. Finally, the Input/Output devices may further include devices that communicate both as inputs and outputs, for instance but not limited to, a modulator/demodulator (modem; for accessing another device, system, or network), a radio frequency (RF) or other transceiver, a telephonic interface, a bridge, a router, etc.

When the computing device is in operation, the processor can be configured to execute software stored within the memory, to communicate data to and from the memory, and to generally control operations of the computing device pursuant to the software. Software in memory, in whole or in part, is read by the processor, perhaps buffered within the processor, and then executed.

The example resolver interface 10 includes several built in test and self check features to verify the operation of the resolver 16 and the resolver interface 10. An off scale driver signal 40 is provided for both the sine and cosine inputs 12, 14. The off scale drive signal inputs a large DC voltage above the normal voltage in response to the lack of the sine/cosine inputs 12, 14. The increased DC voltage is detected by the digital demodulator as an increased average value. As appreciated, a DC voltage will register as a 0 value in the i_sine and i_cosine values. The "0" value is a valid positional indication of the resolver 16 and therefore does not by itself indicate any malfunction. However, an increase in the average value above that which would be expected for any condition of the resolver does provide the desired indication of a malfunction. The off scale drive feature provides an indication of a problem condition without any separate control or special test protocol.

The example resolver interface 10 also includes an internal excitation channel 42 that can be switched over to feed each of the anti-aliasing filters 20, 22, 24 instead of the usual sine, cosine and external excitation signals. Accordingly, the resulting signal received by the FPGA module 30 is known. If the signal received through the multiplexer 26 and A/D converter 28 is not as expected, a fault condition is indicated that would provide an indication that something within the resolver interface 10 is not operating as desired. If the signal received is as expected, than something other than the resolver interface 10 is not operating as is desired. As appreciated, if a fault condition occurs while the external excitation signal is being fed to the resolver 16, then the interface 10 can switch over to the internal channel. If no fault is detected with the internal channel sending an input to each of the filters 20, 22, 24, it is likely that something is not as desired in the resolver 16 or a connection to the resolver.

The digital demodulation technique presented here computes the sine and cosine signal magnitudes and is not adversely affected by sine or cosine signal phase shifts introduced by the cabling system, the signal conditioning circuitry, or the resolver sensor itself The present digital demodulation is not affected by expected reasonable phase shift error introduced between the resolver's excitation and sine and cosine output signals or any reasonable phase shift introduced between the resolver's sinewave and cosine outputs.

An additional test and confirmation process is part of the resolver interface 10 to provide an indication of the phase difference between the resolver sine output and the cosine output relative to the resolver excitation. As is appreciated, a relative phase difference between the excitation, sine and cosine signals from the resolver are commonly part of the resolver specification.

In addition to standard resolver range/checking bit the relative phase of the excitation sine and cosine signals can be computed and utilized to determined sensor health. If the expected phase difference between any of the resolver outputs deviates out of an expected range, it may evidence degradation in resolver performance. Such degradation can be utilized to predict potential failures in resolver performance.

Although a preferred embodiment of this invention has been disclosed, a worker of ordinary skill in this art would recognize that certain modifications would come within the scope of this invention. For that reason, the following claims should be studied to determine the true scope and content of this invention.

What is claimed is:

1. A resolver interface comprising:
    an analog-to-digital (A/D) converter sampling at a sampling frequency;
    a multiplexer time-share multiplexing the A/D converter between a sine input, a cosine input, and an excitation signal; and
    an excitation source generating the excitation signal utilized for generating the sine input and the cosine input that are synchronized with the excitation signal and for producing the sampling frequency for the A/D converter.

2. The resolver interface as recited in claim 1, including a first anti-aliasing filter for filtering the sine input, a second anti-aliasing filter for filtering the cosine input.

3. The resolver interface as recited in claim 2 wherein the first anti-aliasing filter and the second anti-aliasing filter comprise a dual op-amp and a common amplifier package for providing a common gain of the sine and cosine inputs.

4. The resolver interface as recited in claim 2 wherein the first anti-aliasing filter and the second anti-aliasing filter comprise a $4^{th}$ order Butterworth filter.

5. The resolver interface as recited in claim 1, wherein the multiplexer provides interleaved multiplexing of the sine, cosine and excitation signals to the A/D converter.

6. The resolver interface as recited in claim 1, wherein the sine and cosine inputs are sampled at 120 times the excitation frequency.

7. The resolver interface as recited in claim 1, including a field programmable gate array (FPGA) programmed to implement a digital filter for each of the sine, cosine and excitation signals from the A/D converter.

8. The resolver interface as recited in claim 7, wherein the FPGA includes a digital demodulator module performing a digital de-modulation calculation for determining a magnitude and four-quadrant position of the sine and cosine inputs.

9. The resolver interface as recited in claim 1, including an internal channel for directing the excitation signal through a sine signal path and a cosine signal path to isolate fault conditions.

10. A method of monitoring input signals from a resolver comprising the steps of:
    generating an excitation signal with a Field Programmable Gate Array;
    generating a sine input and a cosine input based on the excitation signal that is indicative of a position of a rotating element;
    filtering out of band frequencies from the sine input and the cosine input in separate anti-aliasing filters;

time share multiplexing the sine input and the cosine input to a single Analog/Digital converter;

digitally filtering each of the sine input and the cosine input within a Field Programmable Gate Array (FPGA); and demodulating the sine input and the cosine input within the FPGA at a rate synchronized with a frequency of the excitation signal.

11. The method as recited in claim 10, including the step of sampling the sine and cosine inputs at 120 times an excitation frequency.

12. The method as recited in claim 11, including the step of decimating the sine input and the cosine input from the A/D converter by a factor of 10 to provide a decimated sample rate of 12 times the excitation frequency.

13. The method as recited in claim 11, including the step of routing the excitation signal through a separate anti-aliasing filter and time share multiplexing the excitation signal to the A/D converter with the sine and cosine inputs for checking sine and cosine signal processing paths.

14. A differential position sensor interface comprising:
an analog-to-digital (A/D) converter sampling at a sampling frequency;
a multiplexer time-share multiplexing the A/D converter between first and second differential sensor signals, and an excitation signal, wherein the multiplexer provides interleaved multiplexing of the first and second differential sensor signals and excitation signals to the A/D converter; and
an excitation source generating the excitation signal utilized for generating the first and second differential sensor signals that are synchronized with the excitation signal and for producing the sampling frequency for the A/D converter.

15. The differential position sensor interface as recited in claim 14, including a first anti-aliasing filter for filtering the first differential sensor signal and a second anti-aliasing filter for filtering the second differential sensor signal.

16. The differential position sensor interface as recited in claim 14, wherein the multiplexer provides interleaved multiplexing of the first differential sensor signal, the second differential signal and the excitation signals to the A/D converter.

17. The differential position sensor interface as recited in claim 14, wherein the first and second differential sensor signals are sampled at 120 times the excitation frequency.

18. The differential position sensor interface as recited in claim 14, including a field programmable gate array (FPGA) programmed to implement a digital filter for each of the first and second differential sensor signals and the excitation signals from the A/D converter.

19. The differential position sensor interface as recited in claim 18, wherein the FPGA includes a digital demodulator module performing a digital de-modulation calculation for determining a magnitude and four-quadrant position of the first and second differential position sensor signals.

* * * * *